United States Patent
Nishiwaki

(10) Patent No.: US 11,823,873 B2
(45) Date of Patent: Nov. 21, 2023

(54) SUBSTRATE CARRIER APPARATUS, SUBSTRATE PROCESSING APPARATUS, AND METHOD OF ADJUSTING TEMPERATURE OF SUSCEPTOR

(71) Applicant: ASM IP Holding B.V., Almere (NL)

(72) Inventor: Kazuhiro Nishiwaki, Tama (JP)

(73) Assignee: ASM IP Holding B.V., Almere (NL)

( * ) Notice: Subject to any disclaimer, the term of this patent is extended or adjusted under 35 U.S.C. 154(b) by 691 days.

(21) Appl. No.: 16/780,505

(22) Filed: Feb. 3, 2020

(65) Prior Publication Data

US 2020/0286719 A1    Sep. 10, 2020

Related U.S. Application Data

(60) Provisional application No. 62/814,653, filed on Mar. 6, 2019.

(51) Int. Cl.
| | |
|---|---|
| *H01L 21/67* | (2006.01) |
| *H01J 37/32* | (2006.01) |
| *H01L 21/687* | (2006.01) |
| *H05B 6/06* | (2006.01) |
| *H05B 6/10* | (2006.01) |

(52) U.S. Cl.
CPC .. *H01J 37/32724* (2013.01); *H01L 21/67248* (2013.01); *H01L 21/68764* (2013.01); *H01L 21/68771* (2013.01); *H01L 21/68792* (2013.01); *H05B 6/06* (2013.01); *H05B 6/107* (2013.01); *H01J 2237/20214* (2013.01); *H01J 2237/24585* (2013.01)

(58) Field of Classification Search
CPC ......... H01L 21/68771; H01L 21/67248; H01L 21/67739–6776; H01L 21/687–68792; H01L 21/677–67703; H01L 21/68764
See application file for complete search history.

(56) References Cited

U.S. PATENT DOCUMENTS

| | | | |
|---|---|---|---|
| 6,402,509 B1 * | 6/2002 | Ookura | H01L 21/67248 219/405 |
| 2002/0119679 A1 * | 8/2002 | Ikeya | H01L 21/67742 438/799 |
| 2011/0178626 A1 * | 7/2011 | Kondoh | H01L 21/67766 700/108 |
| 2014/0017041 A1 * | 1/2014 | Jung | G01R 31/2891 414/222.01 |
| 2015/0332912 A1 * | 11/2015 | Nowak | C23C 16/52 438/778 |
| 2016/0071745 A1 * | 3/2016 | Kim | H01L 21/67028 219/121.84 |
| 2016/0148803 A1 * | 5/2016 | Wu | H01L 21/67248 118/712 |

(Continued)

*Primary Examiner* — Aiden Lee
(74) *Attorney, Agent, or Firm* — Studebaker & Brackett PC

(57) ABSTRACT

Examples of a substrate processing apparatus includes a substrate carrier apparatus including a shaft, at least one carrier arm that is fixed to the shaft and rotates as the shaft rotates, and at least one thermometer fixed to the carrier arm, a susceptor, a heater that heats the susceptor, a temperature regulator that controls the heater, and a control unit that acquires a measured temperature, which is a surface temperature, of the susceptor obtained by the thermometer by bringing the carrier arm close to the susceptor and control the temperature regulator.

7 Claims, 6 Drawing Sheets

(56) References Cited

U.S. PATENT DOCUMENTS

2016/0358808 A1* 12/2016 Madsen ................. C23C 16/50
2017/0178939 A1* 6/2017 Omori ............... H01L 21/68764
2017/0271194 A1* 9/2017 Okita ................ H01L 21/68742

* cited by examiner

SUBSTRATE CARRIER APPARATUS, SUBSTRATE PROCESSING APPARATUS, AND METHOD OF ADJUSTING TEMPERATURE OF SUSCEPTOR

TECHNICAL FIELD

Examples are described which relate to a substrate carrier apparatus, a substrate processing apparatus, and a method of adjusting the temperature of a susceptor.

BACKGROUND

One of wafer processing conditions is temperature setting of a susceptor heater (sometimes referred to simply as a heater, hereinafter). The temperature setting of the heater is done for setting the temperature of a substrate on a susceptor at a desired temperature. In order that the temperature of the substrate is set at a desired temperature, the heater is controlled based on a reference value with an offset.

It can take a long time to determine the offset. For example, a series of operations is performed which includes raising the pressure in the chamber to the atmospheric pressure, lowering the temperature of the susceptor, opening the chamber, placing a temperature measuring wafer with a thermometer embedded therein on the susceptor, closing the chamber, raising the temperature of the susceptor, lowering the pressure in the chamber to a near-vacuum pressure, measuring the temperature of the temperature measuring wafer and removing the temperature measuring wafer from the chamber.

The gap value between the measured temperature of the temperature measuring wafer and the required wafer processing temperature specified in the recipe is registered as offset data. In processing a product substrate, the required wafer processing temperature is modified based on the offset data.

However, the method using the temperature measuring wafer described above involves a long downtime for opening and closing the chamber and raising and lowering the temperature in the chamber and therefore cannot be performed frequently. For this reason, the offset data is updated by taking advantage of the opportunity of replacing a heater. Therefore, the offset data can continue to be used even if the difference between the temperature of the heater and the temperature of the substrate varies as the condition of the apparatus varies over time. As a result, substrates can be processed at temperatures that are not ideal for a long time.

SUMMARY

Some examples described herein may address the above-described problems. Some examples described herein may provide a substrate carrier apparatus, a substrate processing apparatus and a method of adjusting the temperature of a susceptor that allow the temperature of a substrate to be set at a desired temperature.

In some examples, a substrate carrier apparatus includes a shaft, at least one carrier arm that is fixed to the shaft and being configured to rotate as the shaft rotates, and at least one thermometer fixed to the carrier arm.

DETAILED DESCRIPTION

Figure 1:
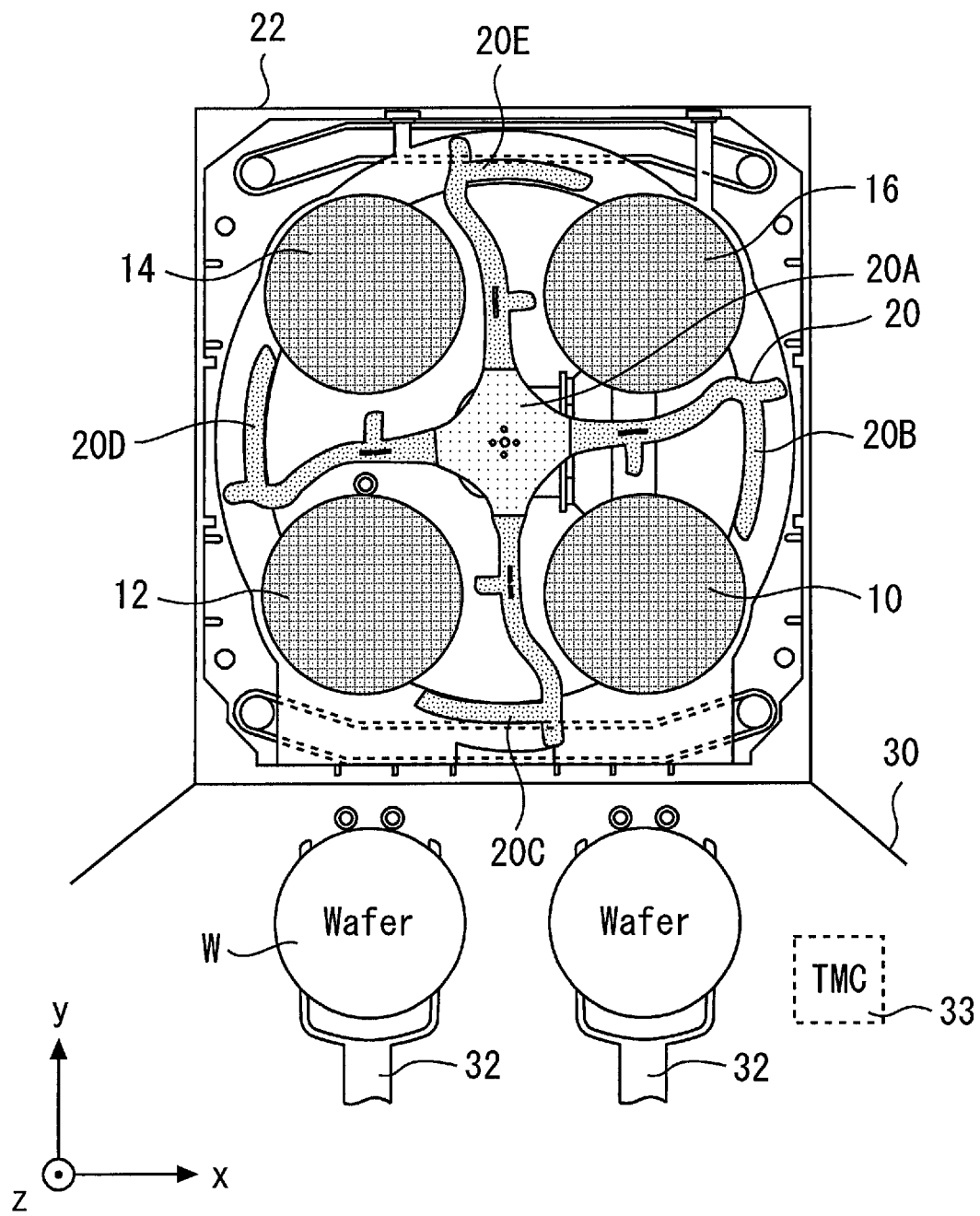
FIG. 1 is a plan view showing an example of a substrate processing apparatus.

A substrate carrier apparatus, a substrate processing apparatus, and a method of adjusting the temperature of a susceptor will be described with reference to the drawings. The same or corresponding components will be denoted by the same reference numerals, and redundant descriptions thereof may be omitted.

FIG. 1 is a plan view showing an example of a configuration of a substrate processing apparatus. The substrate processing apparatus includes susceptors 10, 12, 14 and 16. The substrate processing apparatus includes a substrate carrier apparatus 20 that supplies a substrate to the susceptors 10, 12, 14 and 16 and removes the substrate from the susceptors 10, 12, 14 and 16. The substrate carrier apparatus 20 may includes a shaft 20A, and carrier arms 20B, 20C, 20D and 20E that are fixed to the shaft 20A and rotate as the shaft 20A rotates. The substrate carrier apparatus 20 has at least one carrier arm. As the shaft 20A rotates, the carrier arms 20B, 20C, 20D and 20E rotates about the shaft 20A. The carrier arms 20B, 20C, 20D and 20E move in an x-y plane.

The arrangement described above is enclosed in a housing 22. For example, the substrate processing apparatus may be a quad chamber module (QCM). The QCM can perform the same processing on four substrates on the four susceptors 10, 12, 14 and 16 kept at the same temperature. The processing performed on the substrates may be film deposition using plasma, etching using plasma, or modification of a film by plasma, for example.

A wafer handling chamber 30 is located adjacent to the substrate processing apparatus. In the wafer handling chamber 30, an arm 32 carries a substrate. For example, a substrate held by the arm 32 may be provided to the substrate processing apparatus, or a substrate may be removed from inside the substrate processing apparatus with the arm 32.

Figure 2:
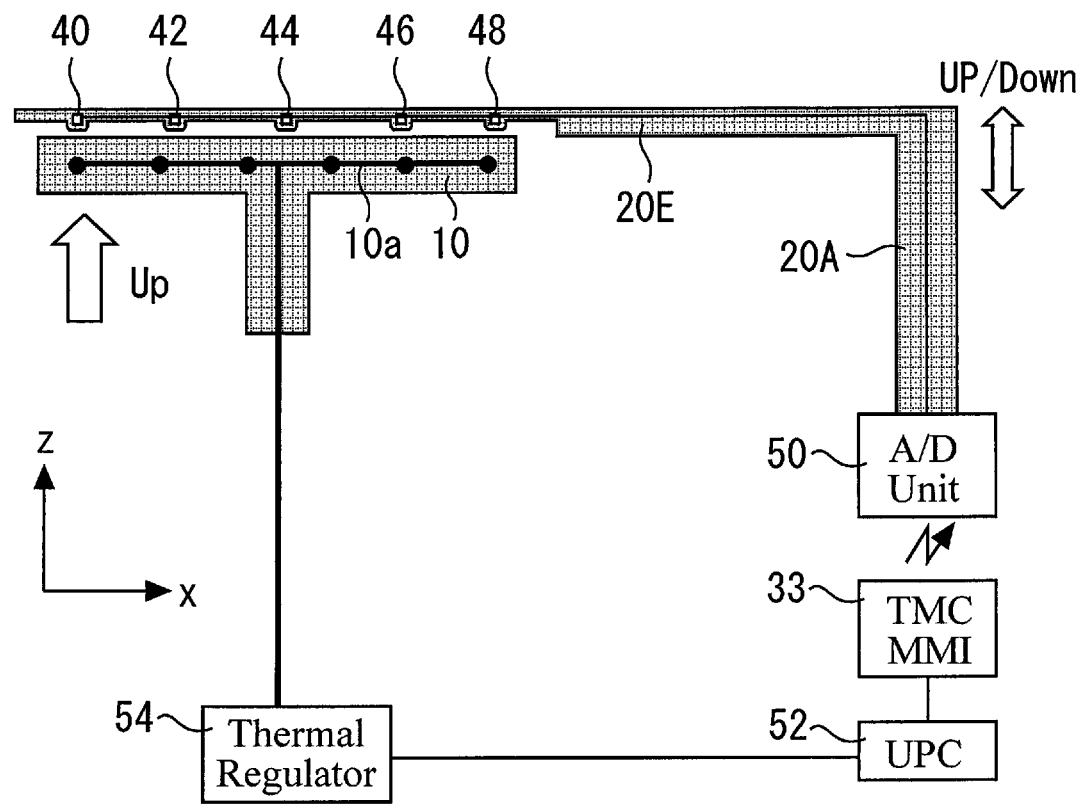
FIG. 2 is a side view showing the example of the substrate processing apparatus.

FIG. 2 is a side view showing the example of the configuration of the substrate processing apparatus. Thermometers 40, 42, 44, 46 and 48 are fixed to the carrier arm 20E. The thermometers 40, 42, 44, 46 and 48 may be thermocouples or resistance temperature sensors, for example. At least one thermometer can be fixed to the carrier arm 20E. In another example, a different number of thermometers can be used. As described above, the substrate carrier apparatus has the shaft 20A, the carrier arms 20B, 20C, 20D and 20E, and the thermometers 40, 42, 44, 46 and 48.

Only one of the carrier arms 20B, 20C, 20D and 20E shown in FIG. 1 may be provided with a thermometer. In the example shown in FIG. 2, of the carrier arms 20B, 20C, 20D and 20E, only the carrier arm 20E has a thermometer fixed thereto. In another example, all of a plurality of carrier arms may be provided with a thermometer. A plurality of thermometers may be provided on one carrier arm, or one thermometer may be provided on one carrier arm.

FIG. 2 shows the susceptor 10 and a heater 10a fixed to the susceptor 10. The heater 10a can be provided at any position for heating the susceptor 10. For example, the heater 10a may be embedded in the susceptor 10 or provided on a lower surface of the susceptor 10. All the susceptors 10, 12, 14 and 16 can be provided with a heater. The heater 10a is controlled by a temperature regulator 54. The temperature regulator 54 receives a command concerning the temperature of the heater 10a from a unique platform controller (UPC) 52, and energizes the heater 10a according to the command.

In an example, when the carrier arm 20E is located directly above the susceptor 10, all the thermometers 40, 42, 44, 46 and 48 fixed to the carrier arm 20E are located directly above the susceptor 10. Similarly, when the carrier arm 20E is located directly above the susceptor 12, 14 or 16, all the thermometers 40, 42, 44, 46 and 48 are located directly above the susceptor 12, 14 or 16.

A transfer unit 50 is connected to the thermometers 40, 42, 44, 46 and 48. In an example, the transfer unit 50 converts the measurement result from the thermometers 40, 42, 44, 46 and 48 into digital data, and transmits the digital data to a control unit. As an example of the control unit, a transfer module controller (TMC) 33 and the UPC 52 are provided. In an example, the transfer unit 50 transmits the digital data on the measurement result (sometimes referred to as a measured temperature, hereinafter) to the TMC 33 by wireless communication. The TMC 33 transfers the digital data on the measurement results to the UPC 52. The UPC 52 updates an offset for a required wafer processing temperature according to a recipe so as to bring the surface temperature of the susceptor 10 close to a target temperature, based on the measured temperature and the temperature of the heater 10a at the time when the measured temperature is obtained. The UPC 52 issues a command including the required wafer processing temperature according to the recipe and the updated offset to the temperature regulator 54. Then, the temperature regulator 54 can be controlled with the updated offset.

Figure 3:
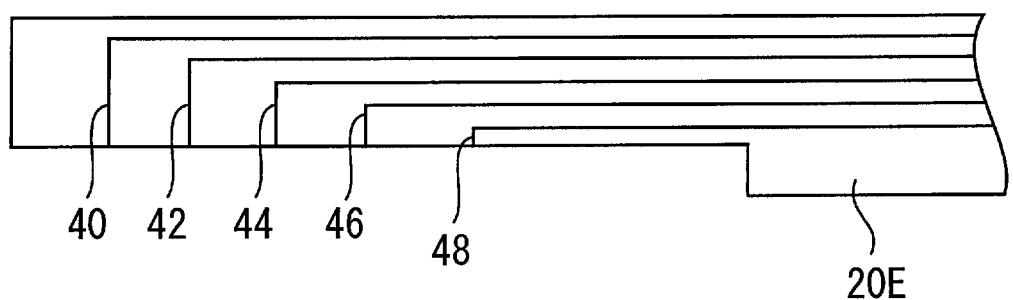
FIG. 3 is a cross-sectional view of the carrier arm.

FIG. 3 is a cross-sectional view of the carrier arm 20E. The thermometers 40, 42, 44, 46 and 48 may be exposed on the back surface of the carrier arm 20E. In another example, the thermometers 40, 42, 44, 46 and 48 may protrude toward the susceptor 10 from the back surface of the carrier arm 20E. In a further example, recesses may be formed in the back surface of the carrier arm 20E, and the thermometers 40, 42, 44, 46 and 48 may protrude in the recesses.

Figure 4:
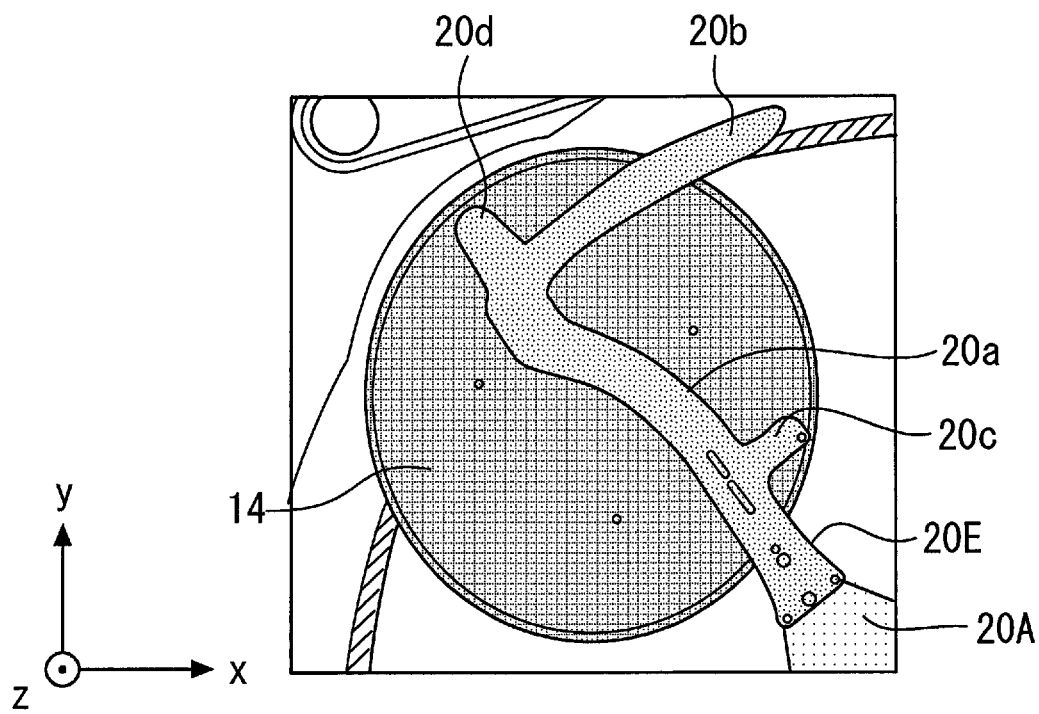
FIG. 4 is a plan view showing an example of the carrier arm.

FIG. 4 is a plan view showing an example of a configuration of the carrier arm. The carrier arm 20E includes a main body part 20a connected to the shaft 20A, a first branch part 20b, a second branch part 20c, and an extension part 20d. The first branch part 20b and the second branch part 20c are parts that branch from the main body part 20a. The extension part 20d is connected to the main body part 20a and is located further from the shaft 20A than the main body part 20a. In an example, the extension part 20d is adjacent to the connection between the main body part 20a and the first branch part 20b. While the carrier arm 20E is rotating, the main body part 20a and the extension part 20d can pass directly above the susceptors 10, 12, 14 and 16. FIG. 4 shows the main body part 20a and the extension part 20d located directly above the susceptor 14 during rotation of the carrier arm 20E.

Figure 5:
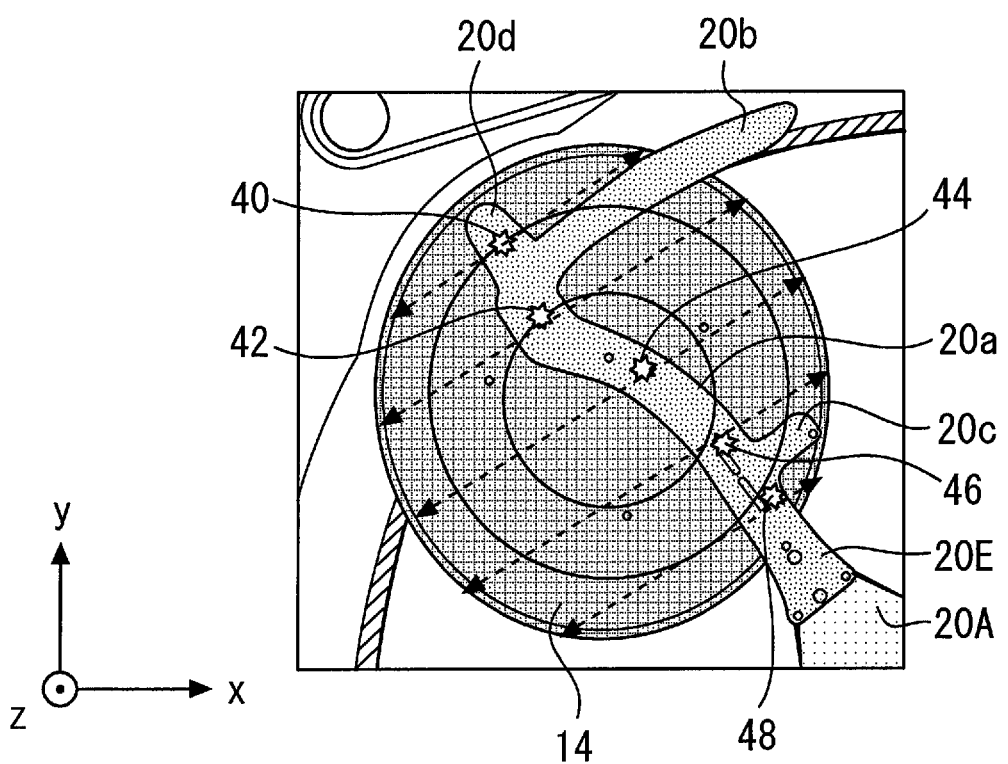
FIG. 5 shows an example of the arrangement of the thermometers.

FIG. 5 shows an example of the arrangement of the thermometers 40, 42, 44, 46 and 48. The thermometers 40, 42, 44, 46 and 48, which are exposed on the back surface of the carrier arm 20E, should not be visible in this plan view, so that FIG. 5 shows the positions at which the thermometers 40, 42, 44, 46 and 48 are exposed on the back surface of the carrier arm 20E for reference. The thermometers 42, 44, 46 and 48 may be fixed to the main body part 20a and exposed on the back surface of the main body part 20a, and the thermometer 40 may be fixed to the extension part 20d and exposed on the back surface of the extension part 20d. The dashed lines in FIG. 5 show an example of trajectories of the thermometers 40, 42, 44, 46 and 48 during rotation of the carrier arm 20E. The thermometers 40, 42, 44, 46 and 48 pass directly above the susceptor 14 and thereby can measure the temperature of the susceptor 14 at the positions indicated by the five dashed lines.

Figure 6:
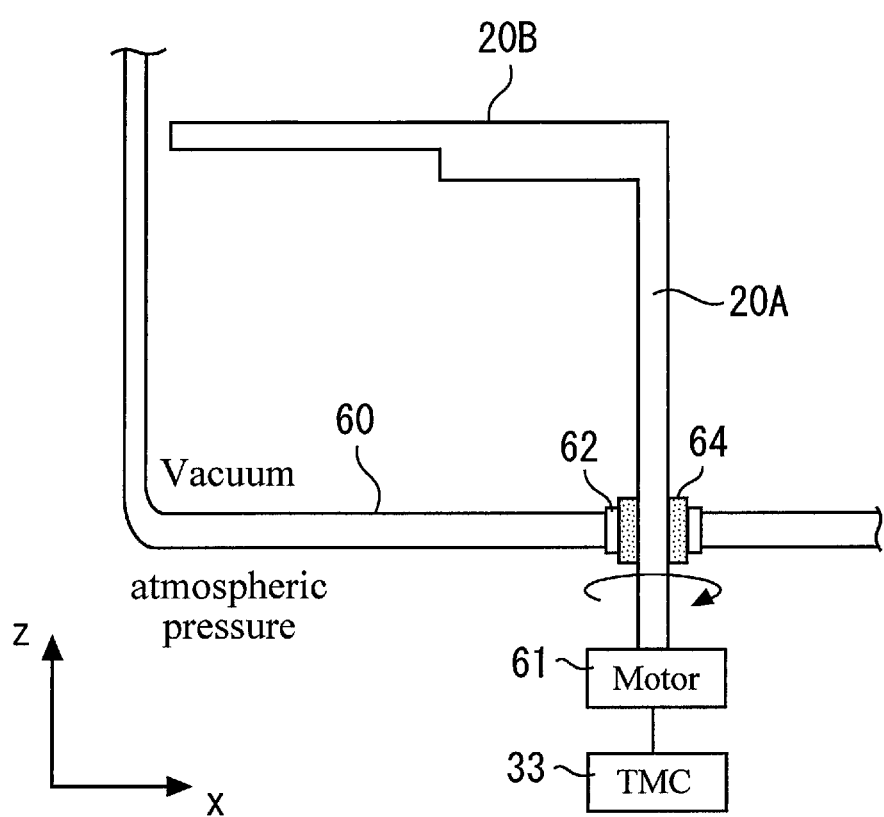
FIG. 6 shows an example of an arrangement for rotation of the shaft.

FIG. 6 shows an example of an arrangement for rotation of the shaft 20A. The shaft 20A extends through a bearing 62 with a magnetic seal 64 interposed therebetween. The bearing 62 can be held on a chamber 60. There is a vacuum in the chamber 60, and the ambient pressure of the chamber 60 is the atmospheric pressure. As a motor 61 rotates the shaft 20A in response to a command from the TMC 33, the carrier arm rotates with the difference in pressure between the outside and inside of the chamber 60 maintained by the magnetic seal 64.

Figure 7:
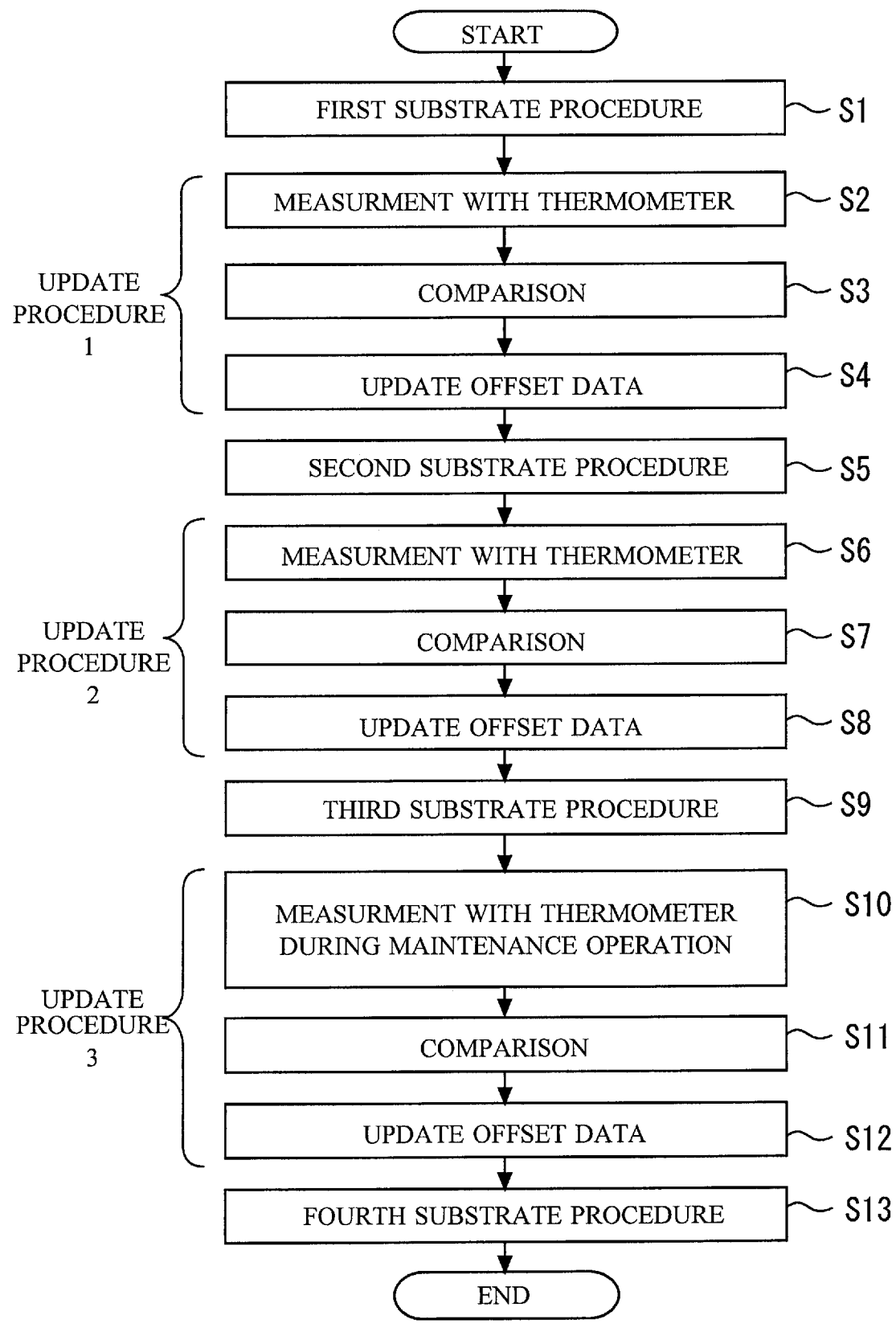
FIG. 7 is a flowchart.

FIG. 7 is a flowchart showing an example of a method of adjusting the temperature of a susceptor. First, in Step S1, a first substrate procedure is performed. The substrate procedure may include placing substrates on the susceptors 10, 12, 14 and 16 with the carrier arms 20B, 20C, 20D and 20E, performing a processing on the substrates, and removing the substrates from the susceptors 10, 12, 14 and 16 with the carrier arms 20B, 20C, 20D and 20E, for example. For the substrate procedure, the temperature regulator 54 sets the heater 10a at a predetermined temperature in response to a command from the UPC 52. More specifically, a command including the required wafer processing temperature according to the recipe with a predetermined offset that is intended to bring the surface temperature of the susceptor 10 close to the target temperature is transmitted to the temperature regulator 54. According to the "required wafer processing temperature according to the recipe" with an offset, the temperature regulator 54 raises the temperature of the heater 10a. For example, the substrate procedure can be performed with the four susceptors 10, 12, 14 and 16 at the same temperature.

The process then proceeds to Step S2. In Step S2, the surface temperature of the susceptors 10, 12, 14 and 16 is measured by at least one thermometer fixed to the carrier arm 20E. In an example, the surface temperature of the plurality of susceptors 10, 12, 14 and 16 can be measured while the carrier arm 20E is rotating. The rotational speed of the carrier arm 20E can be lower than 3.53 seconds/180°. To improve the accuracy of the temperature measurement, the rotational speed of the carrier arm can be equal to or lower than 10 seconds/180°. The reduced rotation speed of the carrier arm provides accurate measured temperature. In view of this, a rotational speed of the carrier arm 20E may be reduced with the increasing of the difference between a measured temperature obtained by the thermometer and a target temperature. In measurement of the surface temperature of the susceptor, the distance between the thermometers 40, 42, 44, 46 and 48 and the susceptor can be equal to or less than 4 mm.

In another example, the surface temperature of the susceptor can be measured by bringing the carrier arm 20E close to the susceptor. More specifically, the temperature is measured by bringing the carrier arm close to the susceptor without rotating the carrier arm. This measurement method can make a contribution to speeding up the measurement.

Figure 8:
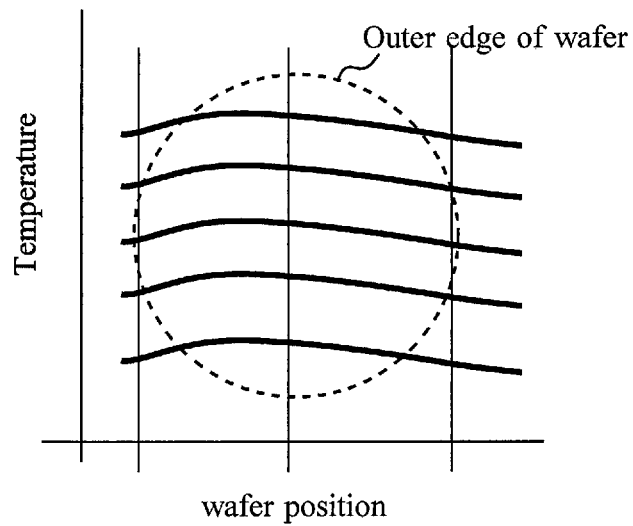
FIG. 8 is an illustration of data obtained by mapping.

If the surface temperature of the susceptor is measured while the carrier arm is rotating, mapping of the surface temperature of the susceptor can be performed. FIG. 8 is an illustration of data obtained by mapping. In the example shown in FIG. 8, five thermometers read different surface temperatures.

If the thermometers are fixed to only the carrier arm 20E, the surface temperature of all the susceptors can be measured by rotating the carrier arm 20E 360°. On the other hand, if the thermometers are fixed to all of the carrier arms 20B, 20C, 20D and 20E, the surface temperature of all the susceptors can be measured by rotating the carrier arms only 90°.

In the measurement of the surface temperature without rotation of the carrier arm, the surface temperature of a susceptor is measured by bringing the carrier arm close to the susceptor, and then the carrier arm is rotated before measuring the surface temperature of another susceptor. If thermometers are fixed to all the carrier arms 20B, 20C, 20D and 20E, the surface temperature of all the susceptors can be measured at the same time by bringing the carrier arms close to different susceptors at the same time.

In an example, if the measured temperature does not fall within a predetermined range, the process is stopped, and a notice of the abnormality can be given. For example, if the temperature measuring system fails or a crack occurs in a susceptor, the process is stopped, and a notice of the abnormality is given to the user so that the problem is solved.

The process then proceeds to Step S3. In Step S3, the UPC 52 compares the measured temperature from the thermometers with a predetermined target temperature. The target temperature may be the required wafer processing temperature according to the recipe, for example. In an example, the UPC 52 determines whether or not the difference between the measured temperature and the target temperature is greater than a predetermined value. For example, if the measured temperature is 455° C., the target temperature is 450° C., and the maximum value of the allowable difference is ±2° C., the UPC 52 determines that offset data on the target temperature needs to be updated. The offset data can be stored in a parameter file in a configuration file in the UPC 52.

The process then proceeds to Step S4. If it is determined in Step S3 that the offset data needs to be updated, the offset data is updated in Step S4. In the example described above, since the measured temperature is 455° C. and the target temperature is 450° C., the offset data is updated to "−5° C". In this example, the condition for updating the offset data is that the difference between the measured temperature and the target temperature is greater than a predetermined value. In another example, however, the offset data may be updated whenever the measured temperature is not equal to the target temperature.

In FIG. 7, the series of processings in Steps S2, S3 and S4 is shown as an update procedure 1 for the offset data.

The process then proceeds to Step S5. In Step S5, a second substrate procedure is performed. The substrate procedure can be the same as the first substrate procedure except for the temperature of the heater 10a. In the second substrate procedure, since the target temperature is 450° C., and the offset data is −5° C., so that the UPC 52 instructs the temperature regulator 54 to set the temperature of the heater 10a at 445° C. Then, the temperature of the susceptor becomes 445° C., and the measured temperature comes closer to 450° C., which is the target temperature.

As described above, details of the control of the heater 10a are modified to reduce the difference between the measured temperature from the thermometers and the target temperature. In this example, details of the control of the heater are modified when the difference is greater than the predetermined value. Therefore, the process can be prevented from being complicated because of frequent modifications of details of the control of the heater. Updating the offset data is just an example of the way of modifying details of the control of the heater, and details of the control of the heater may be modified in other ways.

After the second substrate procedure ends, an update procedure for the offset data is performed again in Steps S6, S7 and S8. The details of Steps S6, S7 and S8 are basically the same as those of Steps S2, S3 and S4. In this update procedure (referred to as an update procedure 2), the offset data is updated if necessary.

In Step S9, a third substrate procedure is performed. The details of the substrate procedure can be the same as those of the first substrate procedure except that the temperature of the heater can be modified. In the third substrate procedure, the UPC 52 issues a command reflecting the latest offset data to the temperature regulator 54. Then, the temperature of the substrate comes closer to the 450° C., which is the target temperature.

Performing measurement of the surface temperature of the susceptor between a plurality of substrate procedures is very simple, compared with the task of determining the offset data that involves placing a dedicated temperature measuring wafer on a susceptor. The update procedure for the offset data may be performed between every substrate procedures or at a particular timing between substrate procedures.

In order to maintain the magnetic seal 64 shown in FIG. 6, for example, the substrate processing apparatus is required to rotate the shaft 20A at regular intervals in addition to the opportunities of rotating the shaft 20A for carrying substrates. The rotations of the shaft 20A at regular intervals can be said as a maintenance operation. The maintenance operation involves rotating the shaft 20A to rotate the carrier arms 20B, 20C, 20D and 20E fixed to the shaft 20A in the state where the carrier arms 20B, 20C, 20D and 20E carry no substrate. The maintenance operation involving rotating the shaft 20A at regular intervals retards deterioration of the magnetic seal 64.

In Step S10, the surface temperature of the susceptor is measured with the thermometers fixed to the carrier arm during one of the rotations of the shaft 20A at regular intervals. In other words, the surface temperature of the susceptor is measured during the maintenance operation. In Steps S11 and S12, the offset data is updated if necessary in the same manner as the update procedures 1 and 2 described above. In an example, this update procedure (referred to as an update procedure 3) including Steps S10, S11 and S12 ends during the maintenance operation.

The update procedure 3 proceeds in parallel with the maintenance operation, so that the substrate procedure can be prevented from being delayed because of the update procedure. In Step S13, a fourth substrate procedure reflecting the latest offset data is performed.

According to the method of adjusting the temperature of the susceptor that involves updating the offset data at an appropriate frequency, the actual temperature of the substrate processed and the required wafer processing temperature according to the recipe can be made to agree with each other or brought close to each other.

The TMC 33 and the UPC 52 shown in FIG. 2 serve as the control unit that acquires the measured temperature, which is the surface temperature, of the susceptor obtained by the thermometers and controls the temperature regulator 54. The control unit may be a single integrated controller.

The invention claimed is:

1. A substrate carrier apparatus, comprising:
a shaft;
a plurality of carrier arms fixed to the shaft and configured to rotate as the shaft rotates, wherein each carrier arm includes a main body part connected to the shaft, a first branch part branched from a side of the main body part in a first direction transverse to the main body part, an extension part connected to the main body part and is located further from the shaft than the main body part, and a second branch part branched from the side of the main body part in the first direction transverse to the main body part,
the first branch part extends further from the main body part than the extension part and the second branch part,
the extension part extends from an end of the main body part in a second direction different from the first branch part and the second branch part, and
the second branch part is located closer to the shaft than the extension part and the first branch part; and
a plurality of thermometers fixed to the main body part and the extension part of at least one of the plurality of carrier arms.

2. The substrate carrier apparatus according to claim 1, all of the plurality of carrier arms are provided with the plurality of thermometers.

3. The substrate carrier apparatus according to claim 1, wherein the plurality of thermometers is exposed on a back surface of the at least one of the plurality of carrier arms.

4. The substrate carrier apparatus according to claim 1, wherein the plurality of thermometers is a thermocouple or a resistance temperature sensor.

5. A substrate processing apparatus, comprising:
a substrate carrier apparatus including a shaft, a plurality of carrier arms fixed to the shaft and configured to rotate as the shaft rotates, wherein each carrier arm includes a main body part connected to the shaft, a first branch part branched from a side of the main body part in a first direction transverse to the main body part, an extension part connected to the main body part and is located further from the shaft than the main body part, and a second branch part branched from the side of the main body part in the first direction transverse to the main body part,
the first branch part extends further from the main body part than the extension part and the second branch part,
the extension part extends from an end of the main body part in a second direction different from the first branch part and the second branch part, and
the second branch part is located closer to the shaft than the extension part and the first branch part; and
a plurality of thermometers fixed to the main body part and the extension part of at least one of the plurality of carrier arms;
a susceptor;
a heater configured to heat the susceptor;
a temperature regulator configured to control the heater; and
a control unit configured to acquire a measured temperature, which is a surface temperature, of the susceptor obtained by the plurality of thermometers and control the temperature regulator.

6. The substrate processing apparatus according to claim 5, wherein the substrate processing apparatus comprises a transfer unit that converts a measurement result from the plurality of thermometers into digital data and transmits the digital data to the control unit.

7. The substrate processing apparatus according to claim 5, wherein the control unit controls the temperature regulator with an updated offset to bring the surface temperature close to a target temperature based on the measured temperature and a temperature of the heater at the time when the measured temperature is obtained.

* * * * *